(12) United States Patent
Lee et al.

(10) Patent No.: US 12,374,595 B2
(45) Date of Patent: Jul. 29, 2025

(54) PACKAGE SYSTEM AND MANUFACTURING METHOD THEREOF

(71) Applicant: Taiwan Semiconductor Manufacturing Company, Ltd., Hsinchu (TW)

(72) Inventors: Pei-Hsuan Lee, Tainan (TW); Ching-Hua Hsieh, Hsinchu (TW); Chien-Ling Hwang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/674,903

(22) Filed: May 26, 2024

(65) Prior Publication Data

US 2024/0312859 A1    Sep. 19, 2024

Related U.S. Application Data

(62) Division of application No. 17/320,198, filed on May 13, 2021, now Pat. No. 12,040,247.

(51) Int. Cl.
*H01L 23/36* (2006.01)
*H01L 21/50* (2006.01)
*H01L 23/40* (2006.01)

(52) U.S. Cl.
CPC ............. *H01L 23/36* (2013.01); *H01L 21/50* (2013.01); *H01L 23/40* (2013.01)

(58) Field of Classification Search
CPC ............ H01L 21/6838; H01L 21/67144; H01L 27/153; H01L 33/62; H01L 33/0095; H01L 33/0093; H01L 33/20; H01L 2933/0033; H01L 2933/0066; H01L 25/0753; H01L 23/5384
See application file for complete search history.

(56) References Cited

U.S. PATENT DOCUMENTS

2022/0344287 A1* 10/2022 Yu ........................... H01L 25/16

* cited by examiner

*Primary Examiner* — Kyoung Lee
*Assistant Examiner* — Christina A Sylvia
(74) *Attorney, Agent, or Firm* — JCIPRNET

(57) ABSTRACT

A manufacturing method of a package system includes: providing a base plate with a first thermal interface material (TIM) layer; placing a semiconductor package on the first TIM layer over the base plate, wherein the semiconductor package comprises a plurality of packaging units arranged in an array and a plurality of electrical connectors surrounding the array of the plurality of packaging units; stacking a gasket and a top plate on the array of the plurality of packaging units, wherein the gasket is interposed between the top plate and the array of the plurality of packaging units; and securing the top plate, the gasket, the plurality of packaging units, and the base plate together through a plurality of fasteners, wherein each of the plurality of fasteners is arranged at a gap between two of the adjacent packaging units.

20 Claims, 11 Drawing Sheets

PACKAGE SYSTEM AND MANUFACTURING METHOD THEREOF

CROSS-REFERENCE TO RELATED APPLICATION

This application is a divisional application of and claims the priority benefit of U.S. application Ser. No. 17/320,198, filed on May 13, 2021. The entirety of the above-mentioned patent application is hereby incorporated by reference herein and made a part of this specification.

BACKGROUND

As the demand for shrinking electronic products has grown, a need for smaller and more creative packaging techniques of semiconductor devices has emerged. The advanced packaging technologies allow production of semiconductor devices with enhanced functionalities and small footprints. Moreover, as electronic products are continuously miniaturized, heat dissipation of the semiconductor packages has become an important issue for packaging technology. There is continuous effort in developing new mechanisms of forming semiconductor packages with better performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
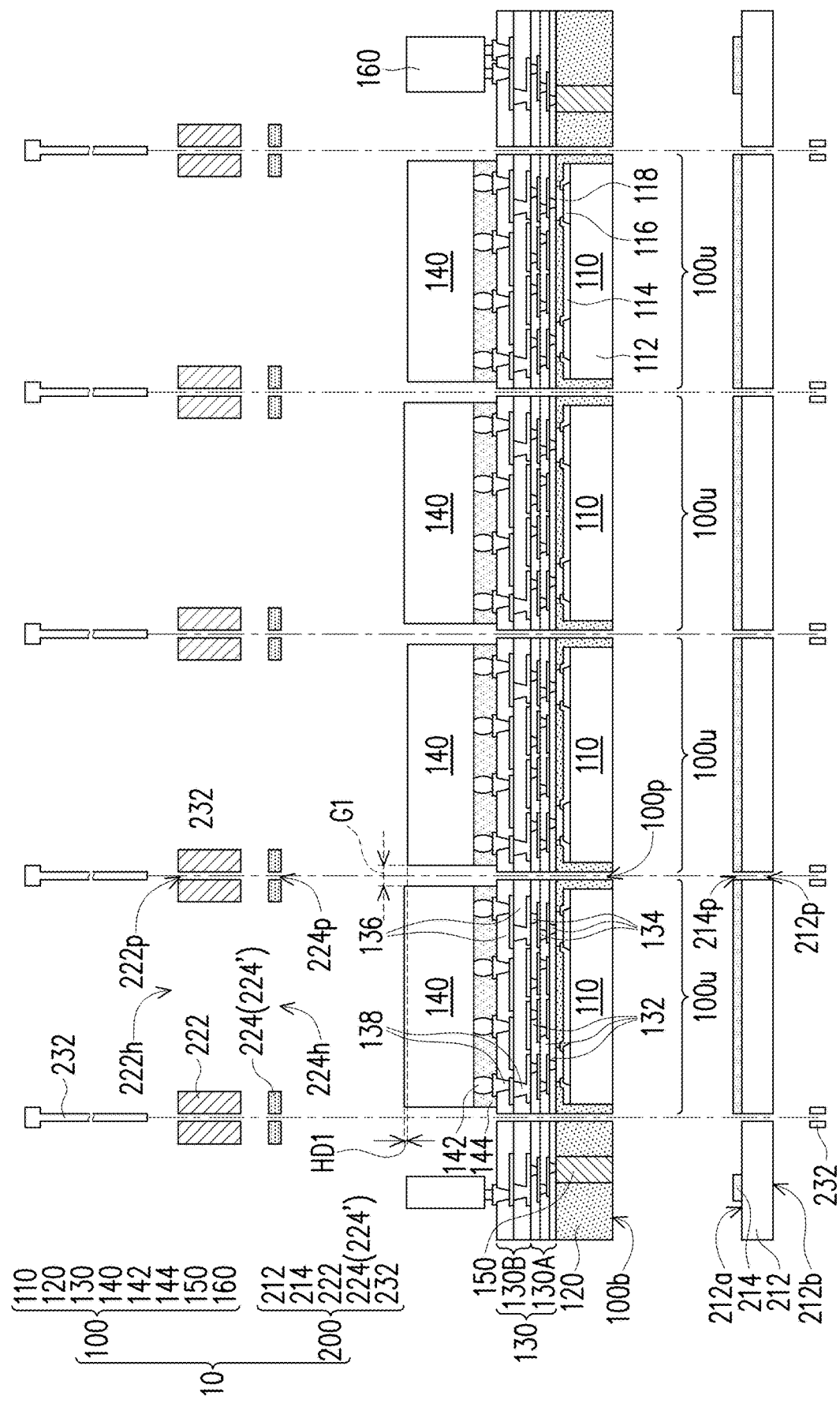
FIG. 1 is a schematic expanded view of a package system according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
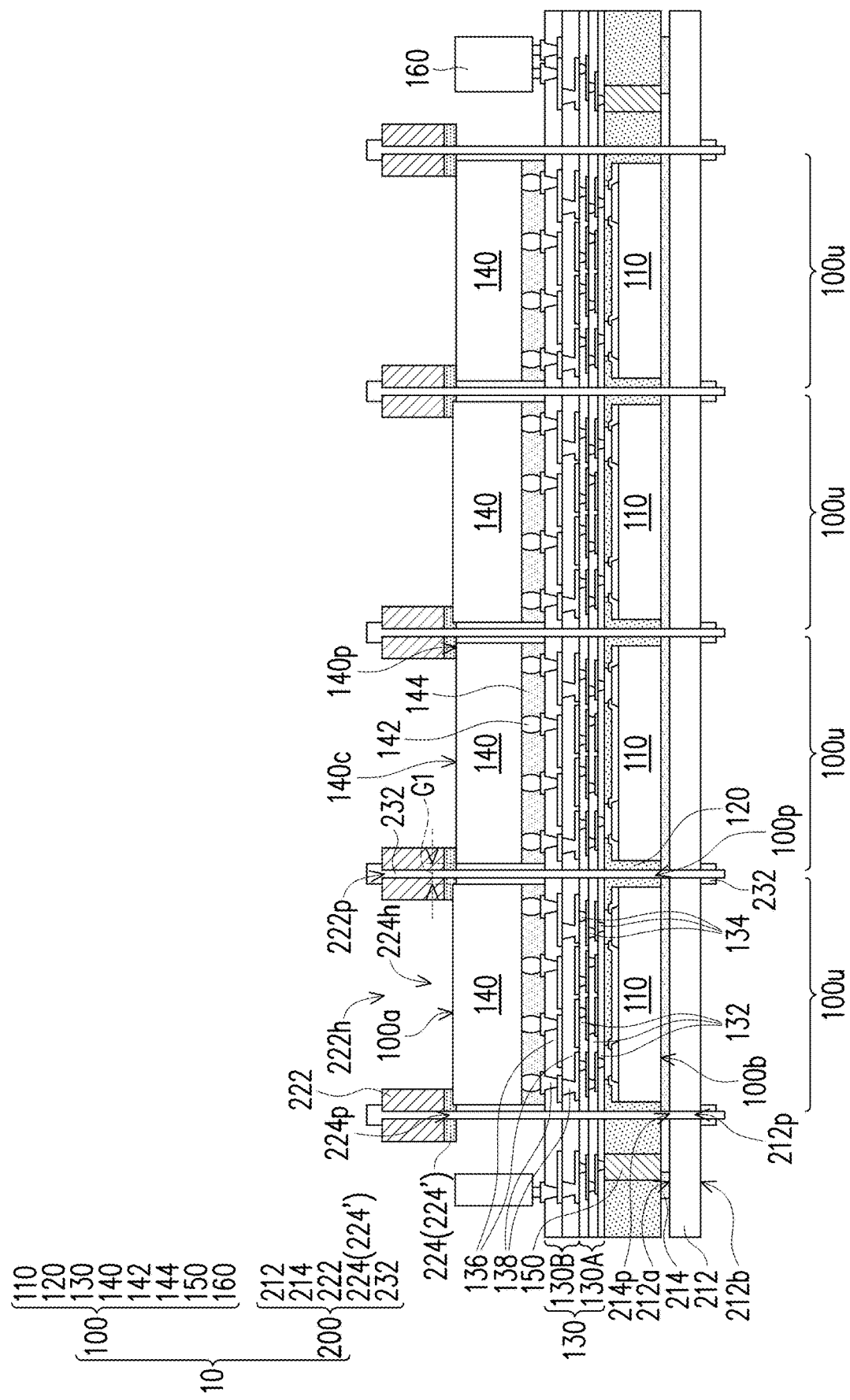
FIG. 2 is a schematic cross-sectional view of a package system of FIG. 1 after assembling in accordance with some embodiments.

FIG. 1 is a schematic expanded view of a package system according to some embodiments and FIG. 2 is a schematic cross-sectional view of a package system of FIG. 1 after assembling in accordance with some embodiments. Referring to FIGS. 1-2, a package system 10 includes a semiconductor package 100 and a mechanical structure 200. The mechanical structure 200 may be configured to assemble together to have the semiconductor package 100 interposed therein. For example, the semiconductor package 100 includes a plurality of first package components 110 encapsulated by an insulating encapsulation 120, a redistribution structure 130 disposed on the first package components 110 and the insulating encapsulation 120, and a plurality of second package components 140 disposed on the redistribution structure 130 opposite to the first package components 110. The first package components 110 may be electrically coupled to the second package components 140 through the redistribution structure 130. In some embodiments, the first package components 110 and/or the second package components 140 are disposed in an array-like configuration of columns and rows in a top view.

In some embodiments, the first package components 110 are/include semiconductor die(s) and may be any type of integrated circuit, such as a processor, logic circuitry, memory, analog circuit, digital circuit, mixed signal, a combination thereof, and/or the like. The first package components 110 may have processing, memory, and/or electronic control functionality integrated on the same die. In some embodiments, the first package components 110 include high-power consuming die(s) and/or low-power consuming die(s). In some embodiments, the first package component 110 is/includes system-on-chip (SoC) or system-on-integrated-circuit (SoIC) devices. For example, the first package component 110 includes a semiconductor substrate 112, electrical elements (e.g., transistors, diodes, capacitors, resistors, inductors, etc.; not shown) on the semiconductor substrate 112, metallization layers (not shown) over the semiconductor substrate 112, a passivation layer 114 over the metallization layer, conductive pads 116 formed over and in electrical contact with the metallization layer, and conductive bumps 118 formed on the conductive pads 116. It is noted that the respective first package component 110 may include various elements that are eliminated from the drawing for ease of illustration.

In some embodiments, the semiconductor substrate 112 includes bulk silicon, doped or undoped, or an active layer of silicon-on-insulator (SOI) substrate. Other substrates (e.g., multi-layered substrates, gradient substrates, or hybrid orientation substrates) may be used. The electrical elements and the metallization layers may be electrically coupled with each other to define one or more circuits configured to perform various functions. The passivation layer 114 made of one or more suitable dielectric materials (e.g., silicon oxide, silicon nitride, low-k dielectrics, or the like) may be formed over the metallization layers to provide a degree of protection for the underlying structures. The conductive pads 116 may include aluminum, but other materials, such as copper, may be used. The conductive bumps 118 may provide conductive regions for contact between the metallization layers and the redistribution structure 130.

The insulating encapsulation 120 may extend along sidewalls of each of the first package components 110 for protection. In some embodiments, the insulating encapsulation 120 laterally covers the conductive bumps 118 of the respective first package component 110, and surfaces of the conductive bumps 118 may be accessibly revealed by the insulating encapsulation 120 for further electrical connection. The surface of the insulating encapsulation 120 may be substantially leveled with the surfaces of the conductive bumps 118 of the respective first package component 110. The material of the insulating encapsulation 120 includes a molding compound, a molding underfill, a resin (such as epoxy), polymer, or the like. Other suitable insulating material that can provide a degree of protection for the first package components 110 may be used.

The redistribution structure 130 disposed between the first package components 110 and the second package components 140 may include a first portion 130A and a second portion 130B stacked upon each other. For example, the first portion 130A of the redistribution structure 130 is in physical and electrical contact with the first package components 110, and the second portion 130B of the redistribution structure 130 is interposed between and electrically connected to the first portion 130A and the second package components 140. For example, the first portion 130A includes a first dielectric layer 132 and a first patterned conductive layer 134 embedded in the first dielectric layer 132. The second portion 130B may include a second dielectric layer 136 disposed on the first dielectric layer 132, and a second patterned conductive layer 138 embedded in the second dielectric layer 136.

In some embodiments, one or more layers of dielectric materials are represented collectively as the first dielectric layer 132, and the first patterned conductive layer 134 may be redistribution wirings that include conductive vias, conductive pads and/or conductive lines that form the electrical connections. For example, these redistribution wirings are formed layer by layer and stacked on the layers of dielectric materials alternately. In some embodiments, the first dielectric layer 132 is formed of a polymeric material such as polybenzoxazole (PBO), polyimide (PI), benzocyclobutene (BCB), or other suitable dielectric material(s). In some embodiments, the first patterned conductive layer 134 is formed of conductive material(s), e.g., copper, titanium, tungsten, aluminum, metal alloy, a combination of these, or the like.

The second dielectric layer 136, similar to the first dielectric layer 132, may include one or more layers of dielectric materials. The material of the second dielectric layer 136 may be the same or similar to the material of the fist dielectric layer 132. Although the number of the first dielectric layer 132 and the number of the second dielectric layer 136 illustrated in FIG. 1 are different, the precise number of dielectric layers of the redistribution structure 130 is dependent upon the circuit design. The second patterned conductive layer 138, similar to the first patterned conductive layer 134, may be redistribution wirings that are formed of the conductive material(s). In some embodiments, the line/spacing of the first patterned conductive layer 134 of the first portion 130A connected to the first package components 110 is less than the line/spacing of the second patterned conductive layer 138 of the second portion. The layout density of the first patterned conductive layer 134 may be greater than the layout density of the second patterned conductive layer 138, for a given area. In some embodiments, since the redistribution structure 130 reroutes the electrical signals of the first package components 110 and expands wider than the size of the first package components 110, the redistribution structure 130 may be referred to as a fan-out redistribution structure. In some embodiments, the semiconductor package 100 is referred to as an integrated fan-out (InFO) package.

In some embodiments, the semiconductor package 100 includes through insulator vias (TIVs) 150 disposed aside the array of the first package components 110 and encapsulated by the insulating encapsulation 120. The TIVs 150 may be electrically coupled to the first package components 110 through the redistribution structure 130. In some embodiments, the TIVs 150 are electrically coupled to the first package components 110 and the second package components 140. In some embodiments, the TIVs 150 provides a vertical connection between the backside and the active side of the first package components 110. Alternatively, the TIVs 150 are omitted. In some embodiments, the semiconductor package 100 includes at least one electrical connector 160 disposed on and electrically connected to the second portion 130B of the redistribution structure 130. The electrical connector 160 may be connected to the second patterned conductive layer 138 of the redistribution structure 130 through conductive joints 142 (or other types of connections). The electrical connector 160 may be configured to connect external device(s). For example, the electrical connector 160 is disposed aside the packaging units 100u for cable connection. In some embodiments, multiple electrical connectors 160 are disposed on the redistribution structure 130 and arranged to surround the array of the packaging units 100u. The electrical connectors 160 may alternatively have other top-view shapes arranged in other patterns and may be positioned in other locations. For example, the precise placement and formation of the electrical connector(s) 160 may be dependent at least in part on the desired functionality and requirements of the package system 10. The configuration of the electrical connector(s) 160 construes no limitation in the disclosure. Alternatively, the semiconductor package 100 is free of electrical connector 160.

In some embodiments, a plurality of conductive joints 142 are disposed between the second portion 130B of the redistribution structure 130 and the second package components 140 to provide electrical connections therebetween. For example, the conductive joints 142 are the solder joints, but other conductive materials may be used to couple the redistribution structure 130 and the second package components 140. The semiconductor package 100 optionally includes an underfill layer 144 disposed between the second package components 140 and the second portion 130B of the redistribution structure 130 to surround the conductive joints 142 for protection. The respective second package component 140 may be or may include an interposer substrate, a circuit board, a wiring board, a system board, a motherboard, and/or other types of circuit carrier. In some embodiments, active elements (e.g., transistors) and/or passive elements (e.g., resistors, capacitors, inductors, etc.) are formed in the second package components 140. In some embodiments, the second package components 140 are semiconductor substrates or dielectric substrates that may not include active/passive elements therein. It is noted that the respective second package component 140 may include various elements that are eliminated from the drawing for ease of illustration.

Continue to FIGS. 1-2, the major surfaces of the second package components 140 that are to be in contact with the mechanical structure 200 may be viewed as a first mating surface 100a of the semiconductor package 100. In some embodiments, the first mating surface 100a is uneven before assembling as shown in FIG. 1. For example, a height difference HD1 of the first mating surface 100a (e.g., the distance between a highest point and a lowest point of the second package components 140) is greater than 100 µm (e.g., about 100 µm to about 1000 µm). In some other embodiments, the height difference HD1 of the first mating surface 100a is less than 700 µm (e.g., about 0 µm to about 700 µm).

In some embodiments, a fan-out packaging process is employed to form the semiconductor package 100. For example, the semiconductor package 100 is formed and provided at wafer level or at panel level. In some embodiments, the semiconductor package 100 is provided with a plurality of receiving holes 100p allocated in an array for receiving fasteners 232 when the mechanical structure 200 is assembled. For example, the respective receiving hole 100p extends along the thickness direction and penetrates through the underfill layer 144, the underlying dielectric layers (132 and 136) of the redistribution structure 130, and the underlying insulating encapsulation 120. In some embodiments, the receiving holes 100p are located in proximity to the corners of the respective second package component 140. In some embodiments, the semiconductor package 100 includes multiple packaging units 100u defined by the receiving holes 100p. It is appreciated that although FIG. 1 shows the semiconductor package 100 having only one first package component 110 and one second package component 140 per packaging unit 100u, each packaging unit 100u may include a varying plurality of package components 110 and/or 140.

In some embodiments, the size (e.g., width or diameter) of the respective receiving hole 100p is less than the gap G1 forming between the adjacent second package components 140. The size, location, and shape of the receiving holes 100p may be adjusted depending on product requirements and construe no limitation in the disclosure. In some embodiments, a gap G1 forming between adjacent second package components 140 is too narrow to form multiple receiving holes (e.g., one of the receiving holes is close to one corner of the second package component 140 and another one of the receiving holes is in proximity to the closest corner of the neighboring second package component 140) in the underlying layers corresponding to the gap G1. For example, the gap G1 is measured from a sidewall (or corner) of one of the second package components 140 to a closest sidewall (or a closest corner) of adjacent one of the second package components 140. The gap G1 may range from about 0.3 mm to about 15 mm, although the gap G1 may include other values. The arrangement of the second package components 140 shown in FIG. 1 is an example, and other arrangements are within the scope of various embodiments.

Still referring to FIGS. 1-2, the mechanical structure 200 includes a plurality of discrete elements that are configured to be assembled together. The mechanical structure 200 may be viewed as an assembled kit in accordance with some embodiments. For example, the mechanical structure 200 includes a base plate 212 provided with a thermal interface material (TIM) layer 214. The TIM layer 214 may be interposed between the base plate 212 and the semiconductor package 100. The surface of the semiconductor package 100 that are to be in physical contact with the TIM layer 214 may be viewed as a second mating surface 100b of the semiconductor package 100 opposite to the first mating surface 100a. For example, the second mating surface 100b includes the back surfaces of the first package components 110, the surfaces of the insulating encapsulation 120, and the surfaces of the TIVs 150, and these surfaces may be substantially leveled. In some embodiments, the surface roughness of the second mating surface 100b is less than the first mating surface 100a.

In some embodiments, the base plate 212 is made of a material that may provide mechanical support and have a good thermal conductivity. For example, the base plate 212 is formed of a material such as stainless steel, aluminum, copper, ceramic, nickel-plated copper, copper tungsten, metal alloy, a combination thereof, or other suitable heat-dissipating material(s). The base plate 212 may be referred to as a cold plate for thermal management in accordance with some embodiments. In some embodiments, the top-view shape of the base plate 212 includes rectangular shape, circular shape, ovular shape, hexagonal shape, polygonal shape, or any other shapes. The base plate 212 may be provided with a plurality of receiving holes 212p aligning with the corresponding receiving holes 100p of the semiconductor package 100 for receiving fasteners 232 when the package system 10 is formed. The size, location, and shape of the receiving holes 212p may be adjusted depending on product requirements and construe no limitation in the disclosure.

The TIM layer 214 may be formed on a first surface 212a of the base plate 212. In some embodiments, the TIM layer 214 is applied to some regions of the first surface 212a of the base plate 212. For example, the regions of the base plate 212 covered by the TIM layer 214 correspond to the array of the first package components 110 and the array of the electrical connectors 160. Although the TIM layer 214 may be formed on any intended area of the base plate 212. In some other embodiments, the first surface 212a of the base plate 212 is entirely covered by the TIM layer 214, except for the receiving holes. The TIM layer 214 may be a viscous, semi-viscous, liquid and/or similar thermal interface material. Suitable materials for the TIM layer 214 may be film, inorganic/organic gels, grease, paste, or the like. For example, the TIM layer 214 is a polymer layer having a good thermal conductivity. The TIM layer 214 may include thermal conductive fillers in the polymer layer for increasing the thermal conductivity. Examples of the thermal conductive filler materials includes aluminum oxide, aluminum nitride, aluminum, copper, silver, indium, boron nitride, a combination thereof, or the like. The TIM layer 214 may include other materials such as metallic-based, solder-based material, etc. In some embodiments, the thermal conductivity of the TIM layer 214 ranges from about 2 W/m·K to about 300

W/m·K. Although the thermal conductivity of the TIM layer 214 may include other values depending on product requirements.

In some embodiments, the semiconductor package 100 is attached to the base plate 212 through the TIM layer 214, when the semiconductor package 100 is assembled to the mechanical structure 200. The heat generated from the semiconductor package 100 may be conducted to the base plate 212 through the TIM layer 214. In some embodiments, the TIM layer 214 has a thickness of about 50 μm to about 2000 μm, although the thickness of the TIM layer 214 may include other values. The TIM layer 214 may have a same shape as the underlying base plate 212. The TIM layer 214 may be provided with a plurality of receiving holes 214p that are in communication with the receiving holes 212p of the base plate 212 for fasteners 232 passing through them, when the mechanical structure 200 is assembled.

In some embodiments, the mechanical structure 200 includes a brace 222 and a gasket 224. When the semiconductor package 100 is assembled to the mechanical structure 200 as shown in FIG. 2, the brace 222 and the gasket 224 are disposed on the semiconductor package 100 and located opposite to the base plate 212 and the TIM layer 214. The brace 222 may be formed of a material such as stainless steel, copper, aluminum, ceramic, nickel-plated copper, copper tungsten, metal alloy, a combination thereof, and/or the like. The brace 222 may be formed of the same or a different material than the base plate 212. In some embodiments, the brace 222 may be a plate provided with a plurality of hollow regions 222h and a plurality of receiving holes 222p. In some embodiments, the top-view shape of the hollow region 222h is a rectangular shape and the top-view shape of the receiving hole 222p is a circular shape. Although the hollow region 222h and the receiving hole 222p may include other shapes (e.g., ovular shape, hexagonal shape, polygonal shape, etc.).

For example, the hollow regions 222h of the brace 222 are arranged in a manner to expose at least a portion of the respective second package component 140 of the semiconductor package 100, when the semiconductor package 100 is assembled to the mechanical structure 200. In some embodiments, the brace 222 is viewed as a top frame including windows exposing the central portion 140c of the second package component 140 of each packaging unit 100u, and each of the receiving holes 222p corresponding to one of the receiving holes 100p of the semiconductor package 100 is disposed in proximity to one corner of the respective packaging unit 100u. In some embodiments, the receiving holes 222p of the brace 222 are substantially aligned with the receiving holes 100p of the semiconductor package 100, the receiving holes 212p of the base plate 212, and the receiving holes 214p of the TIM layer 214 for receiving fasteners 232, when the semiconductor package 100 is assembled to the mechanical structure 200. The sizes, locations, and shapes of the hollow regions 222h and the receiving holes 222p may be adjusted depending on product requirements and construe no limitation in the disclosure.

In some embodiments, the brace 222 and the gasket 224 are separately provided. Alternatively, the gasket 224 is integrated with the brace 222. The gasket 224 may be disposed below the brace 222 to be in contact with the semiconductor package 100, when the semiconductor package 100 is assembled to the mechanical structure 200. For example, when assembled as shown in FIG. 2, the gasket 224 is in physical contact with at least the peripheral portion 140p of the respective second package component 140. In some embodiments, the gasket 224 serving as a barrier member is provided with a plurality of hollow regions 224h and a plurality of receiving holes 224p respectively in communication with the hollow regions 222h and the receiving holes 222p of the brace 222. The sizes, locations, and shapes of the hollow regions 224h and the receiving holes 224p may respectively and substantially match those of the hollow regions 222h and the receiving holes 222p of the brace 222. It should be noted that the shape of the gasket 224 merely serves as an illustrative example, and the disclosure is not limited thereto. The gasket 224 may be formed in various geometric shapes to fill the space between the semiconductor package 100 and the brace 222. In some embodiments, the thickness of the gasket 224 is less than the thickness of the brace 222. For example, the thickness of the gasket 224 ranges from about 500 μm to about 6 mm, although alternatively, the thickness of the gasket 224 may be greater than 3 mm or include other values.

The materials and/or the shapes of the gasket 224 and the brace 222 may be different. In some embodiments, the gasket 224 is compressible and/or deformable. For example, the gasket 224 is made of an elastic material (e.g., rubber, polytetrafluoroethylene (PTFE), polycarbonate (PC), nylon, a combination thereof, and/or the like). The Young's modulus of the elastic material may range from about 0.01 GPa to about 4 GPa. The gasket 224 sandwiched between the semiconductor package 100 and the brace 222 may be a conductive elastomer or an electrically isolating elastomer depending on product requirements. In some embodiments, the gasket 224 undergoes elastic deformation under an allowable load after the semiconductor package 100 is assembled to the mechanical structure 200. Under this scenario, the mating surfaces of the gasket 224 and the semiconductor package 100 are pressed simultaneously, even if the semiconductor package 100 has a great height variation (e.g., the height difference HD1 is greater than 500 μm). For example, the gasket 224 is flexible and configured to have compressibility property at least in its thickness (or height) direction, while the height variation of the stacked elements of the package system 10 may be controlled by using the fasteners 232. For example, when the package system is under great pressure, the deformation of the gasket 224 may expand the mating surface of the gasket 224 along any direction (e.g., thickness direction, width direction, and/or length direction). In some embodiments, the gasket 224 is configured to equalize the pressure between the overlying brace 222 and the underlying second package components 140 of the semiconductor package 100 having different heights. The gasket 224 may serve as a pressure distribution plate in accordance with some embodiments.

In some embodiments, the gasket 224 is replaced with the gasket 224' which is similar to the gasket 224 but includes a rigid material. The gasket 224' may be slightly or not excessively deformed under great loads. For example, the gasket 224' is made of a hard material such as polystyrene (PS), Teflon, carbon fiber, metal (e.g., copper), silicon, graphene, metal alloy, a combination thereof, and/or the like. In some embodiments, the gasket 224' has the Young's modulus ranging from about 0.5 GPa to about 1050 GPa. The gasket 224' may be a sealing member which fills the space between the mating faces of the brace 222 and the semiconductor package 100 to prevent leakage from or into the package system 10 while the mechanical structure 200 is assembled and experiences compression. In some embodiments, the pressure will not be absorbed by the gasket 224'. For example, pressure may be completely transferred from the mechanical structure 200 to the semiconductor package 100 through the gasket 224' without excessive deformation as the package system 10 is under great loads. In some embodiments where the semiconductor package 100 has the height difference HD1 less than 500 μm, the gasket 224' is interposed between the brace 222 and the semiconductor package 100 to evenly distribute the pressure across the first mating surface 100a of the semiconductor package 100.

Still referring to FIGS. 1-2, the mechanical structure 200 includes the fasteners 232 configured to pass through the receiving holes (222p, 224p, 100p, 214p, and 212p). For example, elements (e.g., the brace 222, the gasket 224, and the base plate 212 with the TIM layer 214) of the mechanical structure 200 disposed on two opposing sides of the semiconductor package 100 are joined using the fasteners 232. The fasteners 232 may include screws, bolts and nuts, clips, pins, and/or the like. In some embodiments in which the screw-type fasteners are employed, the fasteners 232 are fastened (or torqued) to allow for the mechanical structure 200 to be securely assembled. As shown in FIG. 2, when assembled, heads of the screw bolts are leaned against the brace 222, body of the screw bolts penetrate through the receiving holes, and the screw nuts are leaned against a second surface 212b of the base plate 212 that is opposite to the first surface 212a. The width (or diameter) of the receiving hole may be substantially equal to or greater than the width (or diameter) of the corresponding fastener (e.g., the body of the screw bolts). It is appreciated that although the fasteners 232 illustrated in FIGS. 1-2 include bolts and nuts, other types of fasteners (e.g., spring-type fasteners, pin-type fasteners, magnetic fasteners, or the like) allowing for ease of assembly and disassembly may be used.

Figure 3:
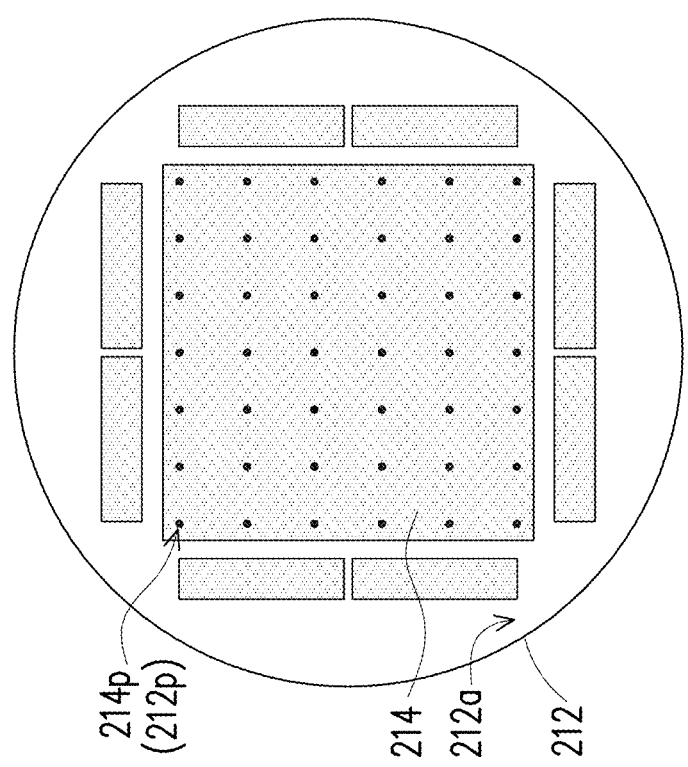

FIGS. 3-6 are schematic top views showing various stages of assembling a package system according to some embodiments. Unless specified otherwise, the components in these embodiments are essentially the same as the like components, which are denoted by like reference numerals shown in FIGS. 1-2. Referring to FIG. 3 and also with reference to FIGS. 1-2, the base plate 212 with the TIM layer 214 is provided. Note that although the base plate 212 is illustrated in a circular shape, other embodiments contemplate other general shapes (e.g., rectangular shape, ovular shape, polygonal shape, etc.) for the base plate 212. The TIM layer 214 may be partially applied to the base plate 212. For example, the TIM layer 214 is applied to the areas that the packaging units 100u and the electrical connectors 160 are to be disposed thereon, and the rest area of the base plate 212 is free of the TIM layer 214. In some embodiments, the TIM layer 214 is applied to the based plate 212 discretely on the areas where the packaging units 100u are subsequently disposed on. The receiving holes 214p of the TIM layer 214 may be substantially aligned with the receiving holes 212p of the base plate 212 and may be arranged in an array including a plurality of rows and a plurality of columns. In some embodiments, the TIM layer 214 fully covers the first surface 212a of the base plate 212, except for the receiving holes.

Figure 4:
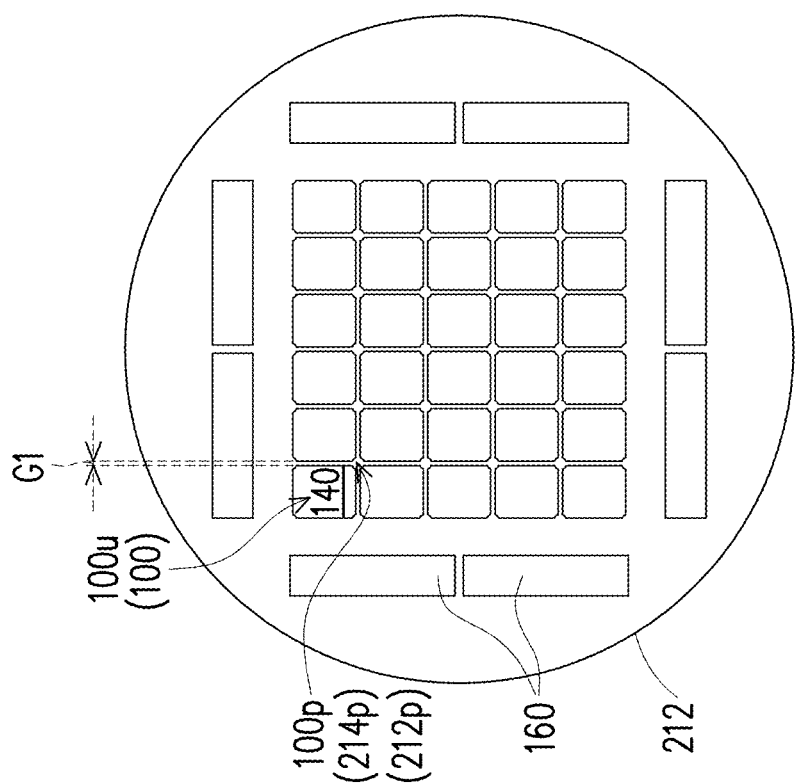
FIGS. 3-6 are schematic top views showing various stages of assembling a package system according to some embodiments.

Referring to FIG. 4 and also with reference to FIGS. 1-2, the semiconductor package 100 is stacked over the base plate 212 so that the TIM layer 214 is interposed between the semiconductor package 100 and the base plate 212. After placing the semiconductor package 100 over the base plate 212, the back surfaces of the second package components 140 may face upwardly, and the first package components 110 and the insulating encapsulation 120 may be in physical contact with the TIM layer 214, as shown in FIGS. 2 and 4. The receiving holes 100p of the semiconductor package 100 may be arranged in an array and substantially aligned with the underlying receiving holes (214p and 212p). In some embodiments, the receiving holes 100p are distributed at the corners of each packaging unit 100u, although other arrangement may be used. As mentioned above, the gap G1 between the sidewalls of the neighboring second package components 140 may be too narrow to arrange more than one receiving holes 100p at each corner of each packaging unit 100u. For example, as shown in FIG. 4, a single receiving hole 100p is formed at two of the neighboring corners of adjacent second package components 140.

Figure 6:
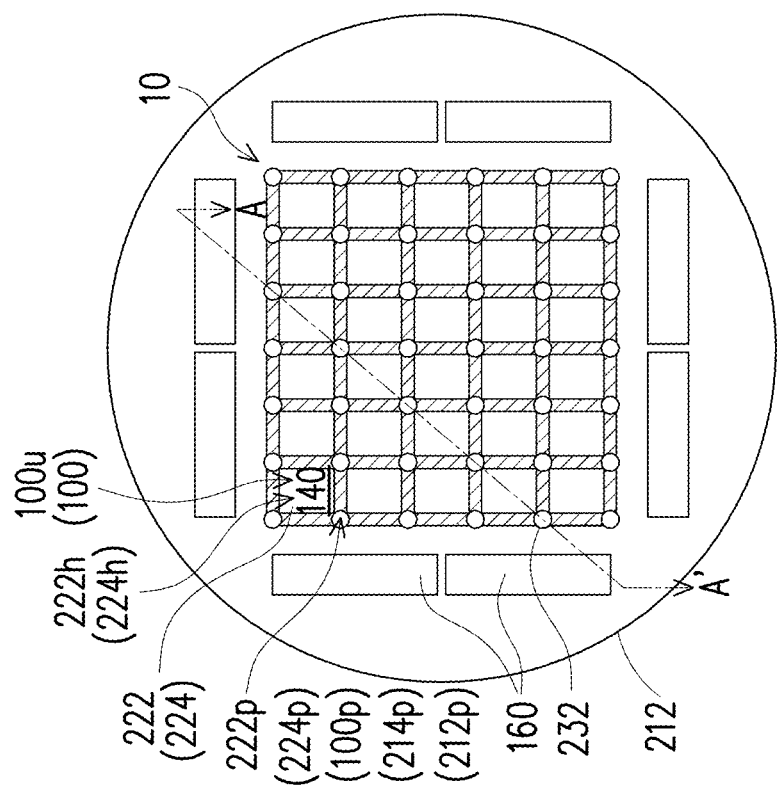
Figure 5:
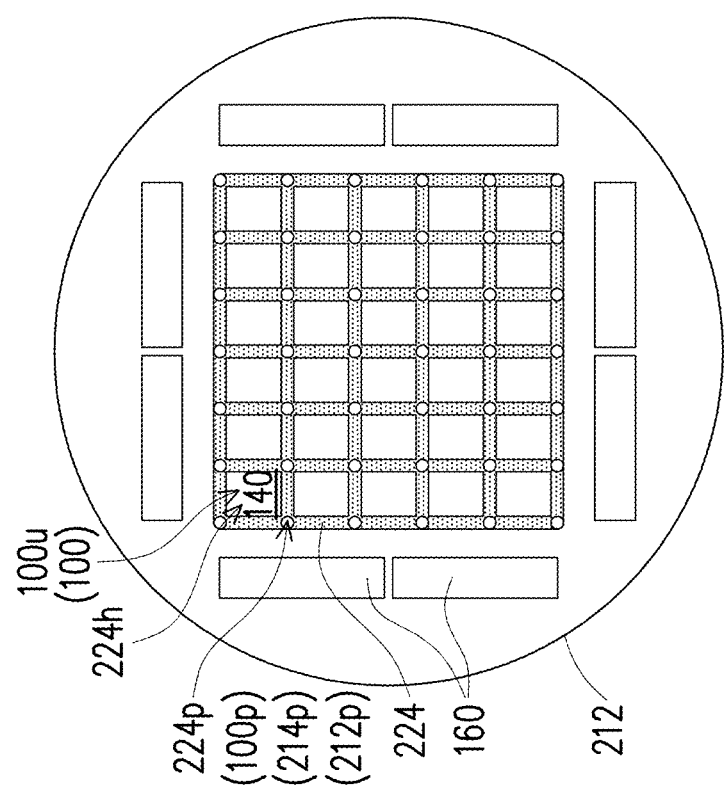

Referring to FIGS. 5-6 and also with reference to FIGS. 1-2, the gasket 224 is placed on the semiconductor package 100. In some embodiments, the gasket 224 is in physical contact with the peripheral portion of the respective second package component 140 of the semiconductor package 100, and the respective hollow region 224h of the gasket 224 may accessibly reveal the rest portion of the second package component 140. As shown in FIG. 5, after disposing the gasket 224 on the second package components 140, the gasket 224 may partially cover the second package components 140 and the electrical connectors 160 may surround the gasket 224. The receiving holes 224p of the gasket 224 may be distributed at the corners of the packaging units 100u and substantially aligned with the receiving holes (100p, 214p, and 212p) of the underlying elements for receiving the subsequently-mounted fasteners.

With continued reference to FIG. 6 and further referencing FIG. 2, the brace 222 may be stacked on the gasket 224. Each of the hollow regions 222h of the brace 222 may be substantially aligned with one of the hollow regions 224h of the gasket 224, so that portions of the second package components 140 are accessibly revealed by the hollow regions (222h and 224h). Similarly, each of the receiving holes 222p of the brace 222 may be substantially aligned with one of the underlying receiving holes for receiving the fasteners 232. In some embodiments, the brace 222 and the gasket 224 are integrated together as an integrated frame. Under this scenario, the integrated frame may be placed on the semiconductor package 100 at one step. As shown in FIG. 6, after disposing the brace 222 on the gasket 224, the electrical connectors 160 may surround the brace 222. Subsequently, individual elements are secured together by inserting the fasteners 232 through the receiving holes and fastening the fasteners 232. For example, the cross-sectional view of the package system 10 shown in FIG. 2 is taken across the dot-dashed line A-A' in FIG. 6 in accordance with some embodiments.

Figure 7:
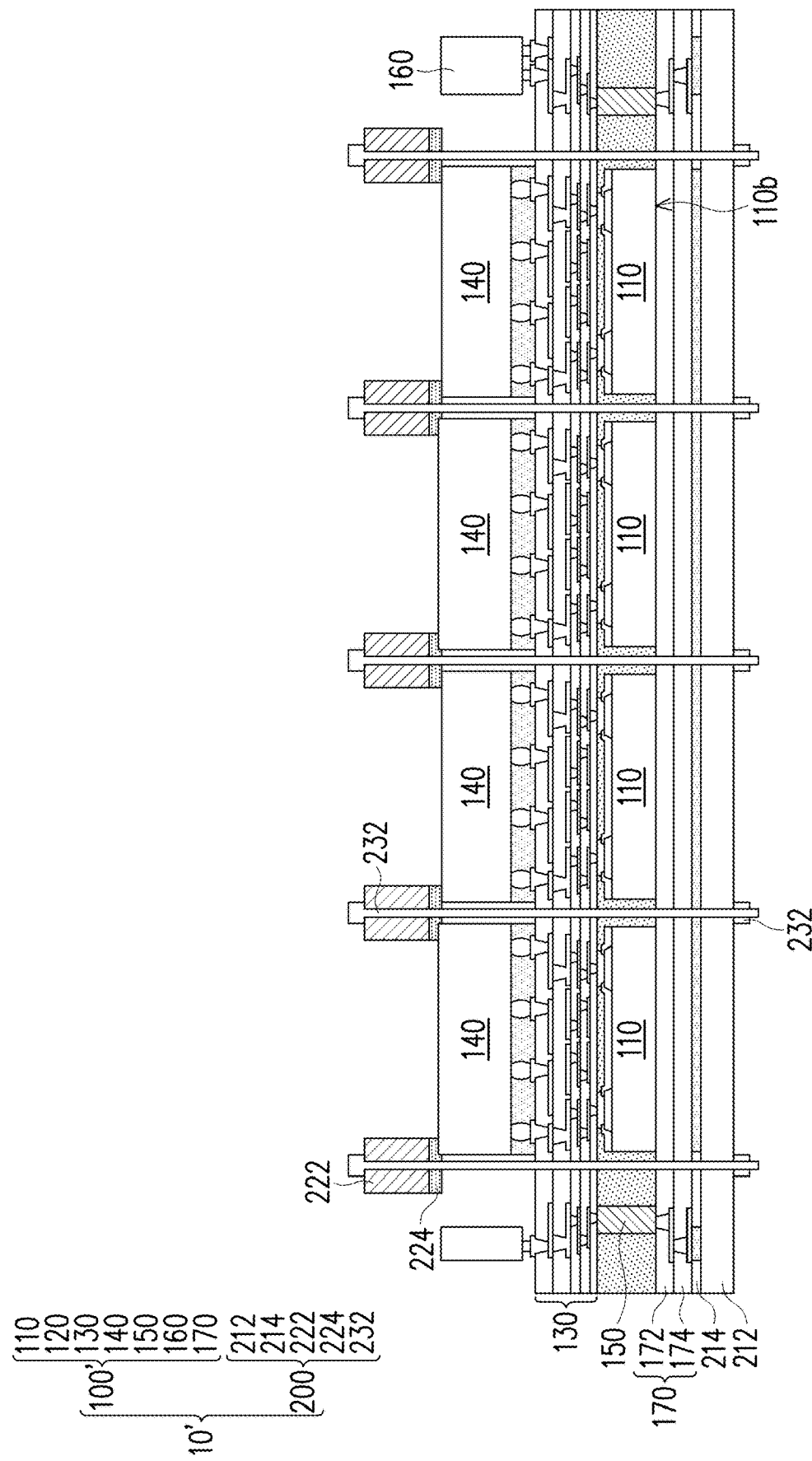
FIG. 7 is a schematic cross-sectional view of another package system in accordance with some embodiments.

FIG. 7 is a schematic cross-sectional view of another package system in accordance with some embodiments. Package systems shown in FIGS. 2 and 7 may be similar, and items in FIGS. 2 and 7 that are the same or similar are indicated by the same reference numerals. Referring to FIG. 7, the package system 10' is similar to the package system 10, except that the semiconductor package 100' of the package system 10' further includes a backside redistribution structure 170 disposed opposite to the redistribution structure 160. For example, the backside redistribution structure 170 is disposed on the back surfaces 110b of the first package components 110 and the surface of the insulating encapsulation 120. In some embodiments, the backside redistribution structure 170 includes at least one dielectric layer 172 and at least one patterned conductive layer 174 embedded in the dielectric layer 172. For example, the patterned conductive layer 174 is in physical and electrical contact with the TIVs 150. The TIVs 150 laterally covered by the insulating encapsulation 120 may provide a vertical conductive path to connecting the redistribution structure 160 and the backside redistribution structure 170 disposed on opposing sides of the TIVs 150. The first package components 110 and/or the second package components 140 may be electrically coupled to the patterned conductive layer 174 through the TIVs 150 and the redistribution structure 160. It is noted that the configuration of the backside redistribution structure 170 serves as an illustrative example and the configuration of the backside redistribution structure 170 may be varied depending on circuit requirements. For example, the backside redistribution structure 170 is similar to the redistribution structure 160. In some embodiments, after the semiconductor package 100' is assembled to the mechanical structure 200, the backside redistribution structure 170 is in physical contact with the TIM layer 214.

Figure 8:
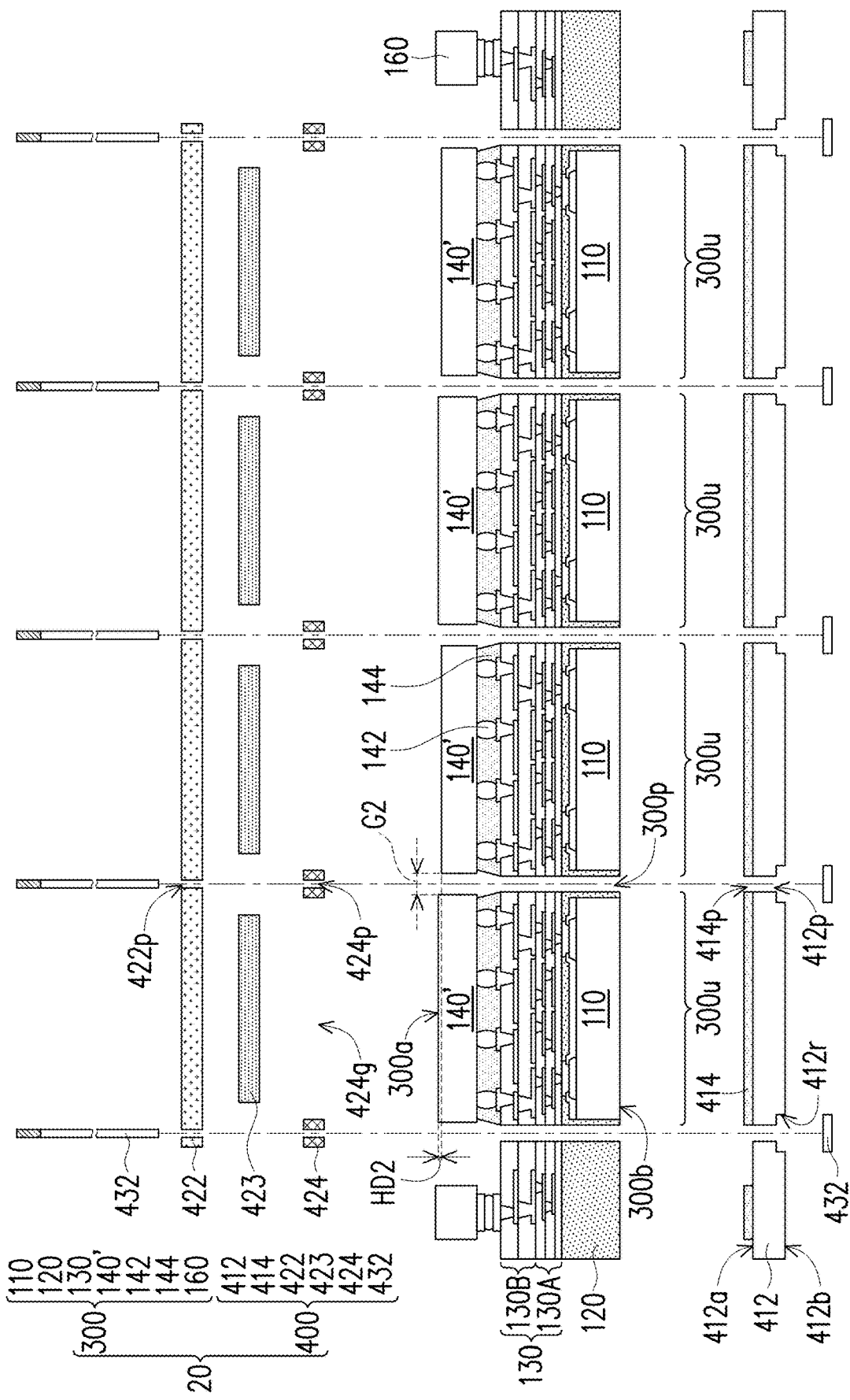
FIG. 8 is a schematic expanded view of a package system according to some embodiments.
Figure 9:
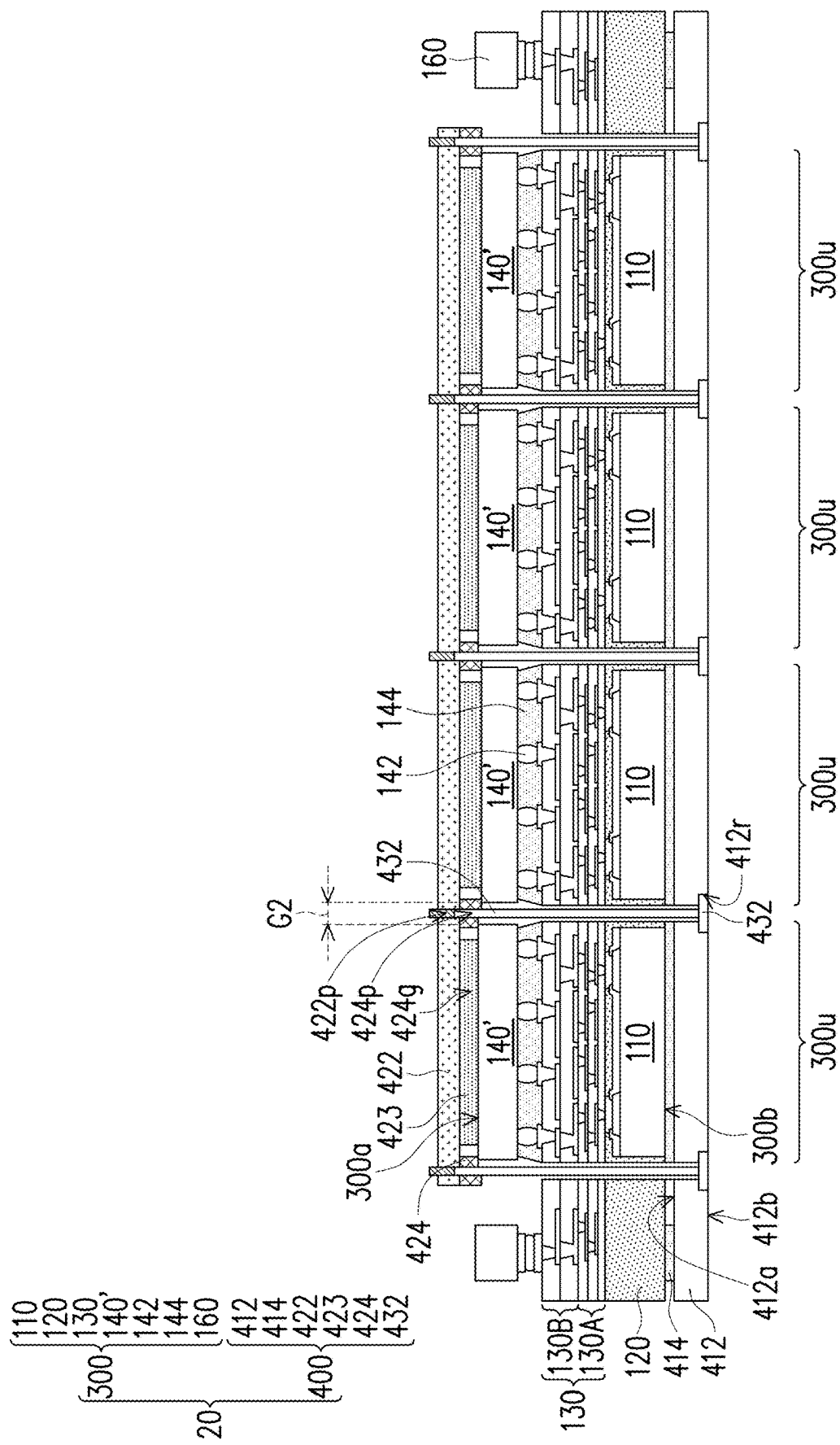
FIG. 9 is a schematic cross-sectional view of a package system of FIG. 8 after assembling in accordance with some embodiments.
Figure 10:
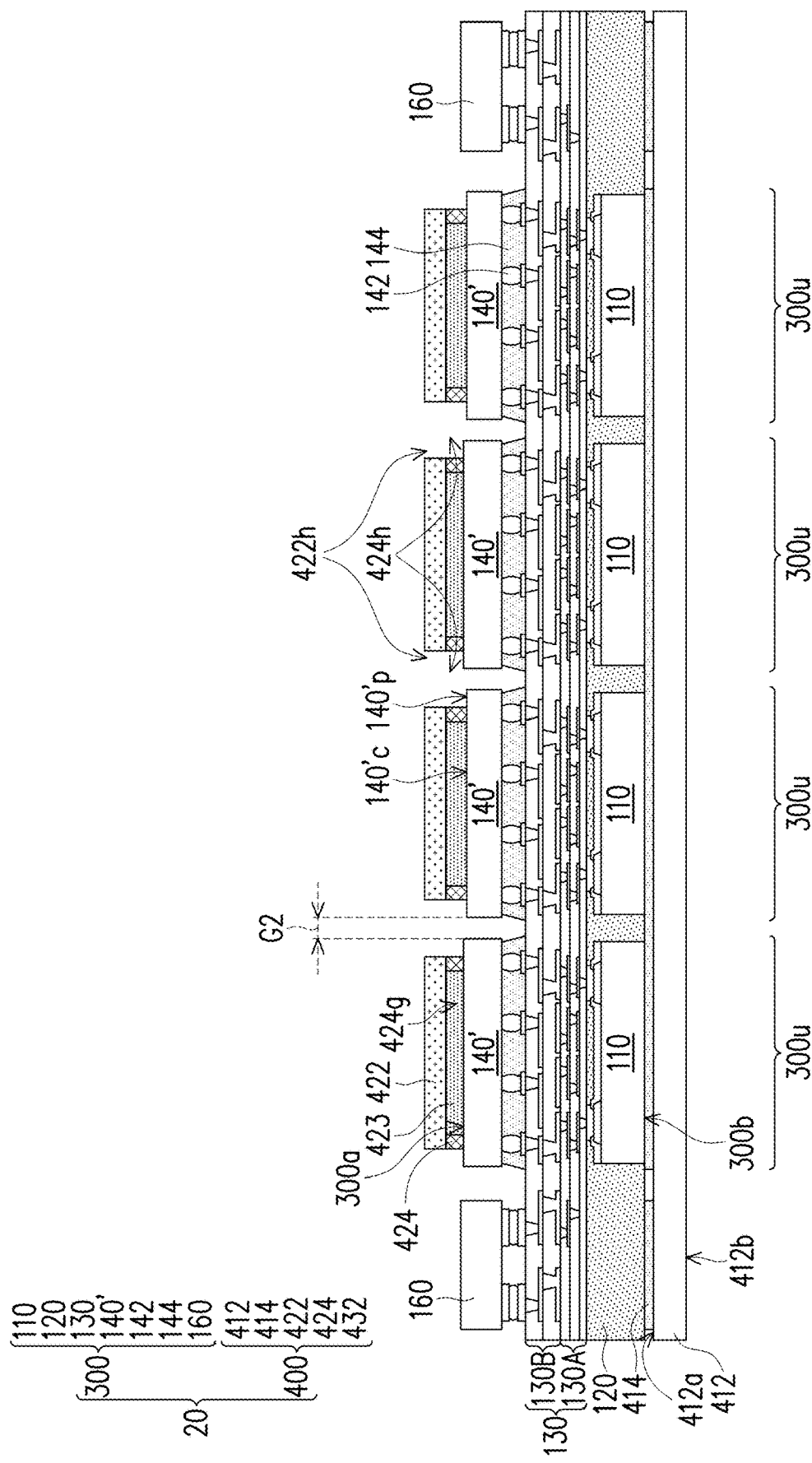
FIG. 10 is another schematic cross-sectional view of a package system of FIG. 8 after assembling in accordance with some embodiments.

FIG. 8 is a schematic expanded view of a package system according to some embodiments, FIG. 9 is a schematic cross-sectional view of a package system of FIG. 8 after assembling in accordance with some embodiments, and FIG. 10 is another schematic cross-sectional view of a package system of FIG. 8 after assembling in accordance with some embodiments. The cross-sectional views of FIGS. 9-10 may be respectively taken along the dot-dashed line B-B' and the dot-dashed line C-C' shown in the top view of FIG. 14. Thus, the fasteners are seen in FIG. 9, but they are not seen in the cross-sectional view of FIG. 10. Throughout the various views and illustrative embodiments, like reference numbers are used to designate like elements.

Referring to FIGS. 8-10, a package system 20 includes a semiconductor package 300 sandwiched in a mechanical structure 400. The semiconductor package 300 may be similar to the semiconductor package 100 described in FIGS. 1-2. For example, the semiconductor package 300 includes more than one first package components 110, the insulating encapsulation 120 extending along sidewalls of the first package components 110, the redistribution structure 130 including the first portion 130A and the second portion 130B disposed on the first package components 110 and the insulating encapsulation 120, and the second package component 140' disposed over the second portion 130B of the redistribution structure 130 and connected to the redistribution structure 130 through the conductive joints 142. The second package component 140' may be similar to the second package component 140 described in FIGS. 1-2. In some embodiments, the second package component 140' is the package component that has heat dissipation need.

In some embodiments, the semiconductor package 300 includes the underfill layer 144 disposed between the redistribution structure 130 and the second package component 140' and laterally covering the conductive joints 142 for protection. The semiconductor package 300 optionally includes the electrical connector 160 disposed on and electrically connected to the second portion 130B of the redistribution structure 130. The semiconductor package 300 may include or may not include the TIV and the backside redistribution structure which depend on product requirements. The arrangement of the semiconductor package 300 shown herein is an example, and other arrangements are within the scope of various embodiments.

In some embodiments, the semiconductor package 300 is provided with the receiving holes 300p, and a plurality of packaging units 300u of the semiconductor package 300 may be defined by the receiving holes 300p. It is appreciated that although FIG. 8 shows the semiconductor package 300 having only one first package component 110 and one second package component 140' per packaging unit 300u, each packaging unit 300u may include a varying plurality of package components 110 and/or 140'. The respective receiving hole 300p may extend along the thickness direction and penetrate through at least the redistribution structure 130 and the underlying insulating encapsulation 120. The receiving holes 300p of the semiconductor package 300 may be substantially aligned with other receiving holes of the stacked structure 400 for receiving the fasteners 432. For example, the receiving holes 300p are located in proximity to the corners of the respective second package component 140'. In some embodiments, the gap G2 between adjacent second package components 140' is too narrow for arranging more than one receiving holes 300p at each corner of the respective second package component 140'. Accordingly, each of the receiving holes 300p is disposed in proximity to one corner of the respective packaging unit 300u. However, the size, location, and shape of the receiving holes 300p may depend on product requirements and construe no limitation in the disclosure.

In some embodiments, the planarity of the second mating surface 300b is greater than the planarity of the first mating surface 300a as shown in FIG. 8. In other words, the first mating surface 300a is rougher than the second mating surface 300b. For example, the major surface of one of the second package components 140' (e.g., the second package component 140' having the greatest height) and the major surface of another one of the second package components 140' (e.g., the second package component 140' having the smallest height) are not leveled, and thus the height difference HD2 forms between these major surfaces to render the first mating surface 300a uneven. In some embodiments, the back sides of the first package components 110 are substantially leveled with the surfaces of the insulating encapsulation 120 to render the second mating surface 300b flat. The height difference HD2 and the gap G2 may be any suitable value depending on product design.

Continue to FIGS. 8-10, the mechanical structure 400 may be referred to as an assembled kit. The mechanical structure 400 includes the base plate 412 with the first TIM layer 414 formed thereon. In some embodiments, the base plate 412 and the overlying first TIM layer 414 include the receiving holes 412p and 414p for receiving the fasteners 432. For example, each of the receiving holes 412p of the base plate 412 is in communication with one of the recesses 412r. The materials and configurations of the base plate 412 and the first TIM layer 414 may be the same or similar to those of the base plate 212 and the TIM layer 214 described in FIGS. 1-2, so the detailed descriptions are not repeated for the sake of brevity. The first TIM layer 414 may be in contact with the second mating surface 300b of the semiconductor package 300 after assembling as shown in FIG. 8. For example, the back sides of the first package components 110 and the portions of the insulating encapsulation 120 surrounding the first package components 110 are in direct contact with the first TIM layer 414. In some embodiments, the first TIM layer 414 is formed on the first surface 412a of the base plate 412, and a plurality of recesses 412r are provided on the second surface 412b of the base plate 412 opposite to the first surface. For example, the recesses 412r on the second surface 412b of the base plate 412 are configured to accommodate head portions of the fasteners after assembled.

The assemble kit 400 includes a top plate 422, a gasket 424 interposed between the top plate 422 and the semiconductor package 300 and including first hollow regions 424g, and a second TIM layer 423 disposed in the first hollow regions 424g of the gasket 424. In some embodiments, the receiving holes 422p of the top plate 422 are substantially aligned with the receiving holes 424p of the gasket 424, and the receiving holes (422p and 424p) may also be substantially aligned with the receiving holes (300p, 414p, and 412p) in the underlying elements for accommodating the fasteners 432. In some embodiments, the top plate 422 includes a plurality of hollow regions 422h arranged along sidewalls of the respective packaging unit 300u as shown in FIG. 10. For example, the solid portion of the top plate 422 covers the central portion 140'c of the respective second package component 140', and the hollow regions 422h of the top plate 422 at least partially reveal the peripheral portion 140'p of the respective second package component 140'. The details of the hollow regions 422h will be described later in accompanying with the top view illustrated in FIG. 13.

The gasket 424 may include second hollow regions 424h corresponding to the hollow regions 422h of the overlying top plate 422 as shown in FIG. 10. In some embodiments, the hollow regions 422h of the top plate 422 and the second hollow regions 424h of the gasket 424 are in communication with one another and accessibly expose at least part of the peripheral portion 140'p of the respective second package component 140', so that the portions of the second package components 140' accessibly revealed by the second hollow regions 424h and the hollow regions 422h may be used to connect external devices (not shown). In some embodiments, each of the first hollow regions 424g of the gasket 424 corresponds to one of the central portions 140'c of the second package components 140'. For example, the respective first hollow region 424g is surrounded by the second hollow regions 424h. In some embodiments, the total hollow area of the second hollow regions 424h, the first hollow regions 424g, and the receiving holes 424p of the gasket 424 is greater than the solid area of the frame parts of the gasket 424. The gasket 424 may be viewed as a hollow gasket. The details of the first hollow regions 424g and the second hollow regions 424h will be described later in accompanying with the top view illustrated in FIG. 11. Alternatively, the hollow regions 422h of the top plate 422 and/or the second hollow regions 424h of the gasket 424 are omitted (e.g., filled by solid parts).

In some embodiments, the gasket 424 includes a hard material such as polystyrene (PS), Teflon, carbon fiber, metal, silicon, graphene, metal alloy, a combination thereof, and/or the like. Other suitable material may be used to form the gasket 424. In some embodiments, the gasket 424 forms a seal between the mating surfaces of the top plate 422 and the semiconductor package 300. The second TIM layer 423 may partially or entirely fill the first hollow regions 424g of the gasket 424, and the second TIM layer 423 may be in physical contact with the top plate 422. The material of the second TIM layer 423 may be the same or similar to the TIM layer 214 described in FIGS. 1-2. After assembling as shown in FIGS. 9-10, the second TIM layer 423 may be physically interposed between the top plate 422 and the second package components 140'. The base plate 412 and the top plate 422 may be referred to as cold plates, and the TIM layers disposed on the cold plates may enhance thermal management for the package system 20.

The mechanical structure 400 may include fasteners 432 configured to pass through the receiving holes (422p, 424p, 300p, 414p, and 412p). In some embodiments in which the screw-type fasteners are employed, the elements of the mechanical structure 400 disposed on the top and the bottom of the semiconductor package 300 may be secured by tightening the fasteners 432. Other type of fasteners (e.g., push-pin fasteners, magnetic fasteners, spring-lock fasteners, etc.) may be used in other embodiments.

Figure 11:
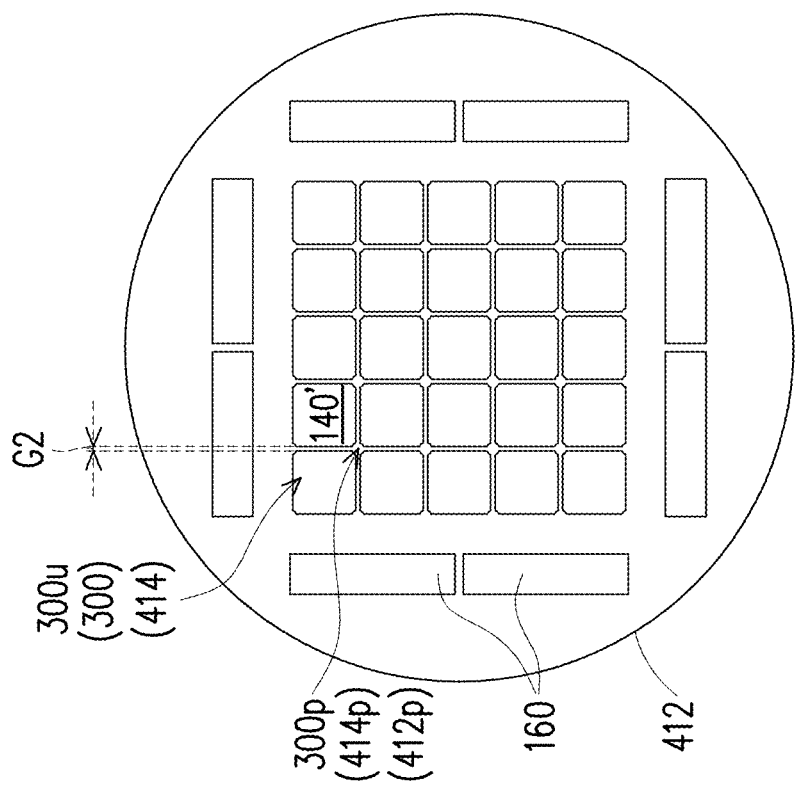
FIGS. 11-14 are schematic top views showing various stages of assembling a package system according to some embodiments.

FIGS. 11-14 are schematic top views showing various stages of assembling a package system according to some embodiments. Unless specified otherwise, the components in these embodiments are essentially the same as the like components, which are denoted by like reference numerals shown in FIGS. 8-10. Referring to FIG. 11 and also with reference to FIGS. 8-10, the base plate 412 with the first TIM layer 414 is provided, and then the semiconductor package 300 may be stacked over the base plate 412 with the first TIM layer 414 interposed therebetween. In some embodiments, the first TIM layer 414 is partially applied to the base plate 412 as the configuration shown in FIG. 3. For example, the first TIM layer 414 is formed on the areas that the packaging units 300u and the electrical connectors 160 are to be disposed thereon. The rest areas of the base plate 412 may free of the first TIM layer 414. Alternatively, the first TIM layer 414 covers the entire surface of the base plate 412. It is appreciated that the first TIM layer 414 may be formed on any intended area of the base plate 412 depending on product requirements.

In some embodiments, the first package components 110 and the insulating encapsulation 120 of the semiconductor package 300 may be in physical contact with the first TIM layer 414. The receiving holes 414p of the first TIM layer 414 may be substantially aligned with the receiving holes 412p of the base plate 412, and each of the receiving holes 414p may be arranged at one corner of the packaging units 300u of the semiconductor package 300. As mentioned above, the gap G2 between the neighboring second package components 140' may be too narrow to arrange more than one receiving holes 300p at each corner of the respective packaging unit 300u. For example, as shown in FIG. 10, a single receiving hole 300p is formed at the neighboring corners of two adjacent packaging units 300u.

Figure 12:
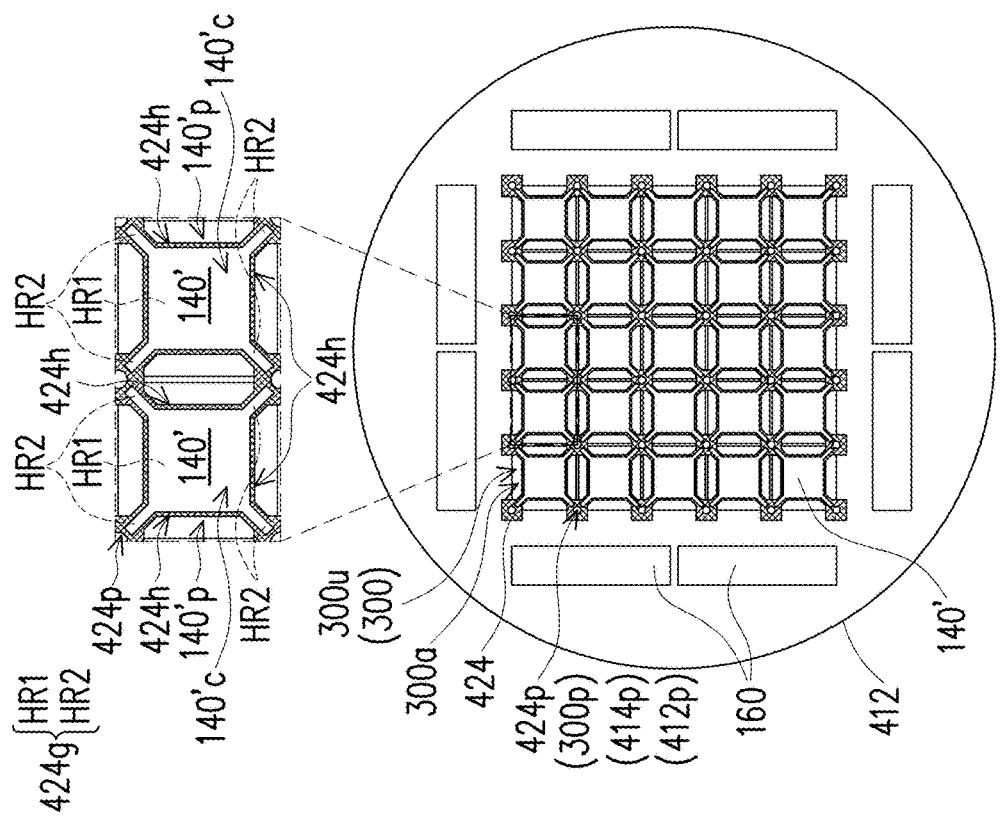

Referring to FIG. 12 and also with reference to FIGS. 8-10, the gasket 424 may be substantially placed on the semiconductor package 300. In some embodiments, the gasket 424 is in physical contact with portions of the first mating surface 300a of the semiconductor package 300. After disposing the gasket 424 on the semiconductor package 300, the gasket 424 partially covers the second package components 140', and the electrical connectors 160 may surround the gasket 224. The receiving holes 424p of the gasket 424 may be distributed at the corners of the packaging units 300u and substantially aligned with the receiving holes (300p, 414p, and 412p) of the underlying elements for receiving the subsequently-mounted fasteners. For example, the respective second hollow region 424h of the gasket 424 is arranged between two adjacent receiving holes 424p without connecting the receiving holes 424p.

In some embodiments where each packaging unit 300u is of a rectangular shape, each second hollow region 424h of the gasket 424 is disposed on one side of the respective packaging unit 300u. For example, the second hollow region 424h has an elongated octagonal shape in the top view, where the elongated sides of the second hollow region 424h may extend substantially along the edge of the corresponding packaging unit 300u. The gap between adjacent second package components 140' may be partially revealed by the second hollow regions 424h. Other embodiments may contemplate other shapes (e.g., rectangular shape, circular shape, ovular shape, other polygonal shape, etc.) for the second hollow region 424h. For example, the peripheral portion 140'p of the respective second package component 140' is partially revealed by the corresponding second hollow region 424h as shown in FIG. 11. The exposed area of the peripheral portion 140'p accessibly revealed by the corresponding second hollow region 424h may depend on the size of the second hollow region 424h, which is not limited in the disclosure.

In some embodiments, each of the first hollow regions 424g of the gasket 424 includes a main area HR1 and at least one buffer area HR2 extending outwardly from the main area HR1. Since the buffer area(s) HR2 extend from the corresponding main area HR1, the buffer area HR2 may be viewed as an extending area of the first hollow region 424g. For example, the main area HR1 of each of the first hollow regions 424g accessibly exposes the central portion 140'c of the underlying second package component 140', and one or more corresponding buffer areas HR2 may accessibly exposes parts of the peripheral portion 140'p and/or the central portion 140'c of the underlying second package component 140'. For example, the main area HR1 of the respective first hollow region 424g has a substantially rectangular (or square) shape in the top view, the buffer areas HR2 are in communication with the main area HR1, and the respective buffer area HR2 may extend from the vertex of the main area HR1 toward the receiving hole 424p without connecting the receiving hole 424p. In some embodiments, the buffer areas HR2 are disposed around the perimeter and extended diagonally from the corners of the corresponding main area HR1 toward the corners of the corresponding packaging unit 300u. The buffer areas HR2 may have a rectangular, circular, oval shape, any other shape, or any combinations thereof in the top view. It is appreciated that the arrangements of the first hollow regions are merely intended to be illustrative, and the configuration of the first hollow region may be varied as desired depending on product requirements. Thus, the first hollow regions are not limited to a particular design, and other configurations of first hollow region are also contemplated in other embodiments.

Figure 13:
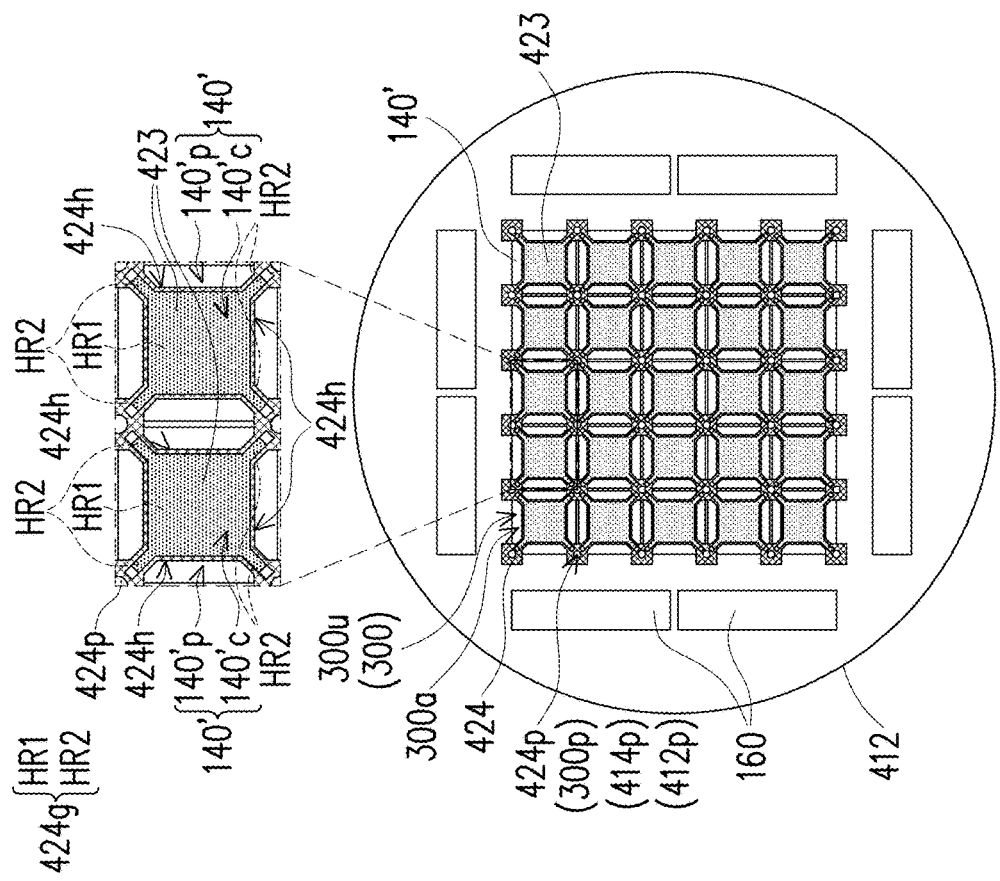
Figure 14:
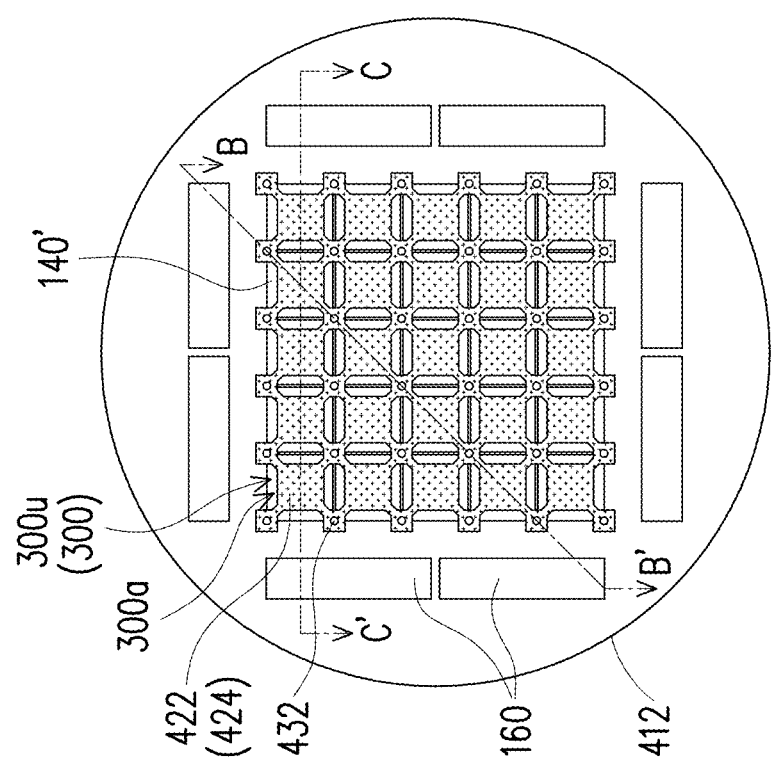

Referring to FIGS. 13-14 and also with reference to FIGS. 8-10, the second TIM layer 423 is disposed within the first hollow regions 424g of the gasket 424, the top plate 422 may be subsequently placed on the gasket 424 and the second TIM layer 423, and then the fasteners 432 are inserted into the receiving holes to secure the package system 20. For example, the semiconductor package 300 and the elements of the mechanical structure 400 are fastened together by the fasteners 432, each of which pass through the receiving holes and restrained at opposing ends of the mechanical structure 400. For example, the fasteners 432 are inserted into the receiving holes along a direction from the base plate 412 toward the top plate 422. After the fasteners 432 are in place, the head portions of the fasteners 432 are disposed in the recesses 412r of the base plate 412 and abutted against the base plate 412. In some embodiments, the bottoms of the fasteners 432 may be screwed into the receiving holes 422p of the top plate 422. It is appreciated that other types of fasteners (e.g., spring-type fasteners, pin-type fasteners, magnetic fasteners, or the like) allowing for ease of assembly and disassembly may be used in the package system 20.

The illustration of the second TIM layer 423 in FIG. 12 may be the status after the semiconductor package 300 is interposed between the mechanical structure 400 and under compression. For example, the second TIM layer 423 is initially applied to the central portions 140'c of the second package components 140' within the main areas HR1 of the first hollow regions 424g of the gasket 424, and after placing the top plate 422 and the fasteners 432 as shown in FIG. 14, pressure may be applied to the package system 20. The second TIM layer 423 may spread within the first hollow regions 424g of the gasket 424 when the package system 20 is under compression.

In some embodiments, the gasket 424 interposed between the top plate 422 and the semiconductor package 300 is configured to equalize the pressures between the packaging units 300u. It is understood that uniformly applying pressure to the semiconductor package 300 relates to the height variation of the second package components 140' across the semiconductor package 300. Since the semiconductor package 300 is provided with the uneven mating surface (i.e. 300a) as shown in FIG. 8, this topography of the semiconductor package 300 may cause non-uniformity in pressure application if no gasket sandwiched between the top plate 422 and the semiconductor package 300. Under this scenario, the second TIM layer 423 applied to the second package components 140' that have non-uniformed heights may suffer from non-uniformity of sizes, resulting in ineffective thermal management for the semiconductor package. Uniformity in pressure application may be improved, by interposing the gasket 424 between the semiconductor package 300 and the top plate 422, so that the semiconductor package 300 with the uneven mating surface has less impact on pressure application. For example, the gasket 424 is used to evenly distribute the pressure applied across the first mating surfaces 300a of the semiconductor package 300 and/or the top plate 422.

In some embodiments in which the first hollow region 424g of the gasket 424 is partially covered by the second TIM layer 423, the main area HR1 is filled by the second TIM layer 423, and the second TIM layer 423 may further extend to partially fill the buffer areas HR2 that are connected to the main area HR. Under this scenario, portions of the underlying second package components 140' corresponding to the first hollow region 424g are unmasked by the second TIM layer 423. The buffer areas HR2 connected to the main area HR1 and extending to the exterior of the main area HR1 may prevent the second TIM layer 423 overflowing outside the first hollow region 424g. The buffer areas HR2 may keep any spillover from the second TIM layer 423 from contaminating other non-intended areas (e.g., the areas where the electrical connectors 160 are disposed on). In some embodiments, the buffer areas HR2 are not covered by the second TIM layer 423, and the main area HR1 connected to the buffer areas HR2 may be partially covered by the second TIM layer 423. In some embodiments where the first hollow region 424g of the gasket 424 is entirely covered by the second TIM layer 423, both of the main area HR1 and the buffer areas HR2 connected to the main area HR are completely filled by the second TIM layer 423. It is appreciated that a greater amount of the second TIM layer 423 is applied to the first hollow region 424g, a larger area of the first hollow region 424g is filled by the second TIM layer 423.

Continue to FIG. 14 and also with reference to FIGS. 9-10, the package system 20 is provided with a double-side heat dissipation scheme, utilizing the base plate 412 with the first TIM layer 414 and the top plate 422 with the second TIM layer 423 as heat dissipating features in order to improve thermal performance. By this configuration, the semiconductor package 300 interposed between the mechanical structure 400 may have lower thermal resistance and uniform heat dissipation characteristic. The package system 20 utilizes the gasket 424 interposed between the top plate 422 and the semiconductor package 300 to allow a uniform pressure to be applied to the respective packaging unit 300u.

In some embodiments, the first hollow regions 424g of the gasket 424 are configured to accommodate the second TIM layer 423, and the respective first hollow region 424g including the main area HR1 and at least one buffer area HR2 is designed to confine the second TIM layer 423 and prevent the second TIM layer 423 from overflowing outside the intended area of the corresponding packaging unit 300u. The gasket 424 may be formed in various geometric shapes and may be made of any suitable material to meet the required packaging needs. The size (e.g., area, thickness, etc.) of the second TIM layer 423 thermally connected to each packaging unit 300u may be uniform by forming the TIM material within the first hollow region 424g of the gasket 424. For example, uniformity in the thickness of the second TIM layer 423 may be achieved on the semiconductor package 300, with the result that the distance between the first mating surface 300a of the semiconductor package 300 and the top plate 422 may be maintained uniform. The heat dissipation characteristic of the semiconductor package 300 may be uniform from one packaging unit 300u to another. The negative impacts (e.g., caused by the uneven mating surface of the semiconductor package 300, the differences in the amount of TIM at various locations, caused by the size differences of the top plate 422 and/or the gasket 424, combination of these, etc.) are substantially reduced or eliminated by interposing the gasket 424 between the semiconductor package 300 and the top plate 422 and applying the second TIM layer 423 to the first hollow regions 424g of the gasket 424.

Figure 15:
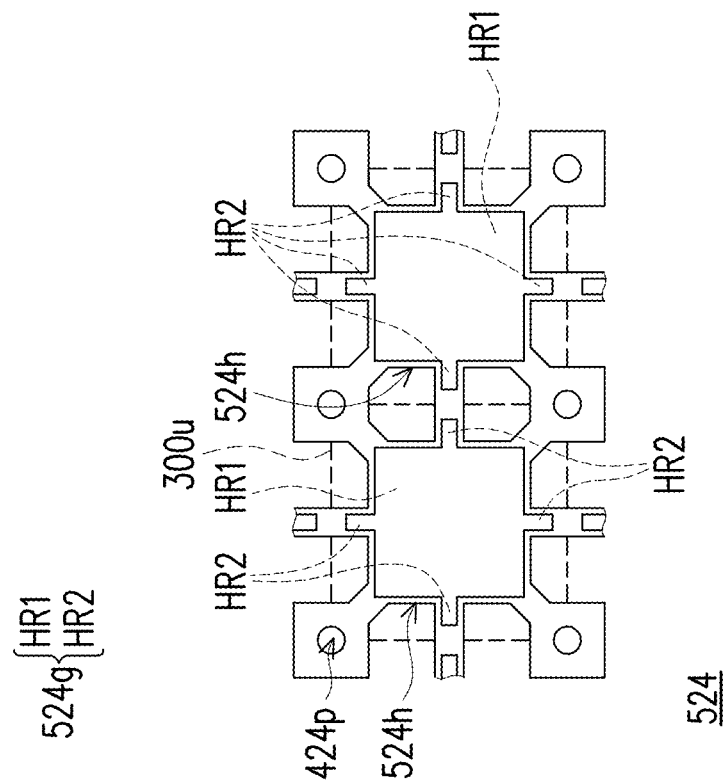
FIG. 15 is a schematic top view partially showing a variation of a gasket according to some embodiment.

FIG. 15 is a schematic top view partially showing a variation of a gasket according to some embodiment. Referring to FIG. 15 and also with reference to FIGS. 12-13, the gasket 524 illustrated in FIG. 15 is similar to the gasket 424 described above. Throughout the various views and illustrative embodiments, like reference numbers are used to designate like elements. As shown in FIG. 15, the gasket 524 includes a plurality of first hollow regions 524g, and the respective first hollow region 524g includes the main area HR1 and at least one buffer area HR2 connected to the perimeter of the main area HR1. In some embodiments, the gasket 524 includes a plurality of second hollow regions 524h disposed surrounding the respective main area HR, and the gaps between the neighboring packaging units 300u may be accessibly exposed by the second hollow regions 524h. Alternatively, the second hollow regions 524h are omitted.

In some embodiments, the main area HR1 is of a rectangular shape in the top view and corresponds to the central portion of the packaging unit (e.g., shown in the dashed line), and multiple buffer areas HR2 may be connected to each side of the main area HR1 and may correspond to the central portion and/or the peripheral portion of the packaging unit. The main areas HR1 may have/include a rectangular, circular, oval shape, any other shape, or any combinations thereof, in the top view in accordance with some embodiments. For example, the respective buffer area HR2 extends from the edge of the corresponding main area HR1 toward the center of the adjacent second hollow region 524h. In some embodiments, one buffer area HR2 of the first hollow region 524g is substantially aligned with another buffer area of the neighboring first hollow region 524g, but not in communication with each other. In other embodiments, the buffer area HR2 of the first hollow region 524g is staggered with another buffer area of the neighboring first hollow region 524g. The respective buffer area HR2 may form an interconnected channel and/or have a rectangular, circular, oval shape, any other shape, or any combinations thereof, in the top view in accordance with some embodiments. For example, the buffer areas HR2 connected to the main area HR1 prevent any spillover of the second TIM layer that is in physical and thermal contact with the packaging unit from overflowing to other non-intended area such as the peripheral area of the base plate.

In accordance with some embodiments, a manufacturing method of a package system includes: providing a base plate with a first thermal interface material (TIM) layer; placing a semiconductor package on the first TIM layer over the base plate, wherein the semiconductor package comprises a plurality of packaging units arranged in an array and a plurality of electrical connectors surrounding the array of the plurality of packaging units; stacking a gasket and a top plate on the array of the plurality of packaging units, wherein the gasket is interposed between the top plate and the array of the plurality of packaging units; and securing the top plate, the gasket, the plurality of packaging units, and the base plate together through a plurality of fasteners, wherein each of the plurality of fasteners is arranged at a gap between two of the adjacent packaging units.

In accordance with some embodiments, a manufacturing method of a package system includes: forming a semiconductor package, wherein the semiconductor package comprises a first surface and a second surface opposing to each other, a planarity of the second surface is greater than that of the first surface and coupling a thermal-dissipating structure to the semiconductor package. Coupling a thermal-dissipating structure to the semiconductor package includes: forming a first TIM layer on a base plate; securing the base plate to the semiconductor package with the first TIM layer interposed between the base plate and a bottom of the semiconductor package; and securing a top plate and a gasket to the semiconductor package, wherein the gasket interposed between the top plate and a top of the semiconductor package, the gasket comprises a plurality of hollow regions corresponding to a plurality of portions of the first surface of the semiconductor package.

In accordance with some embodiments, a manufacturing method of a package system includes: forming a semiconductor package, wherein the semiconductor package comprises a first side and s second side opposite to the first side and coupling a mechanical structure to the semiconductor package. Coupling a mechanical structure to the semiconductor package includes: forming a TIM layer on a base plate; coupling a base plate to the semiconductor package, wherein the TIM layer is interposed between the base plate and the first side of the semiconductor package; and coupling a top plate and a gasket to the semiconductor package, wherein the gasket is interposed between the top plate and the semiconductor package, and the gasket is deformed following a topography of the second side of the semiconductor package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a package system, comprising:
    providing a base plate with a first thermal interface material (TIM) layer;
    placing a semiconductor package on the first TIM layer over the base plate, wherein the semiconductor package comprises a plurality of packaging units arranged in an array and a plurality of electrical connectors surrounding the array of the plurality of packaging units;
    stacking a gasket and a top plate on the array of the plurality of packaging units, wherein the gasket is interposed between the top plate and the array of the plurality of packaging units; and
    securing the top plate, the gasket, the plurality of packaging units, and the base plate together through a plurality of fasteners, wherein each of the plurality of fasteners is arranged at a gap between two of the adjacent packaging units.

2. The manufacturing method of claim 1, wherein the gasket comprises an elastic material, when the top plate, the gasket, the plurality of packaging units, and the base plate are secured together through the plurality of fasteners, the gasket is deformed following a topography of a mating surface of the array of the plurality of packaging units.

3. The manufacturing method of claim 1, further comprising:
    applying a second TIM layer to the array of the plurality of packaging units before stacking the gasket and the top plate on the array of the plurality of packaging units, wherein the second TIM layer on each of the plurality of packaging units is confined by a hollow region of the gasket.

4. The manufacturing method of claim 3, wherein the hollow region of the gasket comprises a main area and a buffer area extending to an exterior of the main area, and when the top plate, the gasket, the plurality of packaging units, and the base plate are secured together through the plurality of fasteners, the second TIM layer on the respective packaging unit extends from the main area toward the buffer area of the hollow region of the gasket.

5. The manufacturing method of claim 4, wherein the main area of the hollow region overlies a central region of a corresponding one of the plurality of packaging units, and the buffer area of the hollow region comprises extensions extending outwardly from the main area and overlying a peripheral region of the corresponding one of the plurality of packaging units.

6. The manufacturing method of claim 4, wherein the buffer area of the hollow region comprises extensions extending diagonally from corners of the main area of the hollow region.

7. The manufacturing method of claim 1, wherein the top plate is provided with a plurality of first hollow regions, the gasket is provided with a plurality of second hollow regions, stacking the gasket and the top plate on the array of the plurality of packaging units comprises:
    aligning each of the plurality of first hollow regions with one of the plurality of second hollow regions and a corresponding one of the plurality of packaging units.

8. The manufacturing method of claim 1, wherein the gasket is provided with a first thickness, the top plate is provided with a second thickness, and the first thickness of the gasket is less than the second thickness of the top plate.

9. The manufacturing method of claim 1, wherein after securing the top plate, the gasket, the plurality of packaging units, and the base plate together through a plurality of fasteners, the gasket fills a space between a mating face of the top plate and the array of the plurality of packaging units.

10. The manufacturing method of claim 1, wherein providing the base plate with the first TIM layer comprises:
    applying the first TIM layer to the base plate discretely on areas where the plurality of packaging units are to be disposed on.

11. A manufacturing method of a package system, comprising:
    forming a semiconductor package, wherein the semiconductor package comprises a first surface and a second surface opposing to each other, a planarity of the second surface is greater than a planarity of the first surface; and
    coupling a thermal-dissipating structure to the semiconductor package comprising:
        forming a first TIM layer on a base plate;
        securing the base plate to the semiconductor package with the first TIM layer interposed between the base plate and a bottom of the semiconductor package; and
        securing a top plate and a gasket to the semiconductor package, wherein the gasket interposed between the top plate and a top of the semiconductor package, the gasket comprises a plurality of hollow regions corresponding to a plurality of portions of the first surface of the semiconductor package.

12. The manufacturing method of claim 11, wherein when securing the top plate and the gasket to the semiconductor package, the gasket is deformed following a topography of the semiconductor package.

13. The manufacturing method of claim 11, wherein the semiconductor package comprises a plurality of packaging units, the gasket comprises a hard sealing material in physical contact with the top plate and peripheries of the packaging units of the semiconductor package.

14. The manufacturing method of claim 11, wherein coupling the thermal-dissipating structure to the semiconductor package further comprises:
    forming a second TIM layer on the top of the semiconductor package, wherein after securing the top plate and the gasket to the semiconductor package, the second TIM layer is within the plurality of hollow regions of the gasket and coupled to the top plate and the top of the semiconductor package.

15. The manufacturing method of claim 11, wherein forming the semiconductor package comprises:
    encapsulating a first package component with an insulating encapsulation, wherein after forming the first TIM layer, the first package component is in contact with the first TIM layer of the thermal-dissipating structure;
    forming a redistribution structure on the insulating encapsulation and the first package component; and
    disposing a second package component on the redistribution structure opposite to the first package component, wherein the first package component and the second package component are electrically coupled through the redistribution structure.

16. A manufacturing method of a package system, comprising:
    forming a semiconductor package, wherein the semiconductor package comprises a first side and a second side opposite to the first side; and coupling a mechanical structure to the semiconductor package comprising:
forming a TIM layer on a base plate;
coupling the base plate to the semiconductor package, wherein the TIM layer is interposed between the base plate and the first side of the semiconductor package; and
coupling a top plate and a gasket to the semiconductor package, wherein the gasket is interposed between the top plate and the semiconductor package, and the gasket is deformed following a topography of the second side of the semiconductor package.

17. The manufacturing method of claim 16, wherein the top plate and the gasket comprise a plurality of windows, and each of the plurality of windows accessibly exposes at least a portion of the semiconductor package.

18. The manufacturing method of claim 16, wherein coupling the top plate and the gasket to the semiconductor package comprises using a plurality of fasteners.

19. The manufacturing method of claim 16, wherein after coupling the top plate and the gasket to the semiconductor package, the gasket seals a space between a mating surface of the top plate and the semiconductor package.

20. The manufacturing method of claim 16, wherein forming the semiconductor package comprises:
forming an encapsulated die, wherein the encapsulated die comprises a back surface in contact with the first TIM layer of the mechanical structure;
forming a redistribution structure on the encapsulated die; and
disposing a circuit board on the redistribution structure to be electrically coupled to the encapsulated die.

* * * * *